(12) United States Patent
McConnell et al.

(10) Patent No.: US 10,571,508 B2
(45) Date of Patent: Feb. 25, 2020

(54) SYSTEMS AND METHODS OF DETECTING CABLE CONNECTIVITY IN A SMART HOME ENVIRONMENT

(71) Applicant: Google Inc., Mountain View, CA (US)

(72) Inventors: Nevin McConnell, San Francisco, CA (US); Daran Wang, Los Altos, CA (US); Nicholas Sims, San Francisco, CA (US)

(73) Assignee: GOOGLE LLC, Mountain View, CA (US)

( * ) Notice: Subject to any disclaimer, the term of this patent is extended or adjusted under 35 U.S.C. 154(b) by 607 days.

(21) Appl. No.: 15/153,262

(22) Filed: May 12, 2016

(65) Prior Publication Data

US 2017/0328943 A1 Nov. 16, 2017

(51) Int. Cl.
*G01R 31/00* (2006.01)
*G01R 31/04* (2006.01)
*G01R 31/40* (2020.01)

(52) U.S. Cl.
CPC ........... *G01R 31/041* (2013.01); *G01R 31/40* (2013.01)

(58) Field of Classification Search
CPC .............................. G01R 31/041; G01R 31/40
See application file for complete search history.

(56) References Cited

U.S. PATENT DOCUMENTS

| | | | |
|---|---|---|---|
| 7,015,596 B2 | 3/2006 | Pail | |
| 2007/0096727 A1* | 5/2007 | Rempt | G01N 27/904 324/238 |
| 2008/0197811 A1* | 8/2008 | Hartular | H01M 10/44 320/141 |
| 2008/0222438 A1 | 9/2008 | Lin et al. | |
| 2013/0188405 A1* | 7/2013 | Jin | H02M 1/32 363/49 |
| 2014/0132194 A1* | 5/2014 | Okita | G05B 19/4062 318/563 |
| 2017/0045407 A1* | 2/2017 | Nishikawa | G01L 9/06 |

FOREIGN PATENT DOCUMENTS

| | | |
|---|---|---|
| CN | 2731515 Y | 10/2005 |
| CN | 101383627 A | 3/2009 |
| CN | 204350072 U | 5/2015 |
| WO | 2012146024 A1 | 11/2012 |

* cited by examiner

*Primary Examiner* — Jeff W Natalini

(74) *Attorney, Agent, or Firm* — Morris & Kamlay LLP

(57) ABSTRACT

Systems and methods detecting cable connectivity in a smart home environment are provided, including controlling, at a controller, an output of a notification when a condition is determined based on at least one signal received by the controller, converting, at a power converter coupled to a power source, power received by the power source for the controller, coupling, at a cable having at least one connector that includes a plurality of pins, the power converter and the controller together, and providing the converted power via a power pin and the at least one signal via an identification pin to the controller, and outputting, at the controller, the notification based on a determination that there is a power outage with the power supply or that the power converter is disconnected from the power source based on a detected output level of the at least one signal.

9 Claims, 9 Drawing Sheets

(1) When the cable is disconnected between the power converter 200 and the controller 73, the pull-up resistor pulls the receiving portion of the cable interface for an identification pin of cable 150 to a predetermined high output level, and the signal is tied to ground at the power converter 200

SYSTEMS AND METHODS OF DETECTING CABLE CONNECTIVITY IN A SMART HOME ENVIRONMENT

BACKGROUND

Traditional home security systems are typically affected by a power loss to the system controller. Some traditional systems may have battery backups to supply power. Alarm systems that operate over traditional phone lines can typically continue to communicate with a monitoring center in the event of a power outage, so long as the telephone lines are not damaged. That is, the phone lines may typically remain operational, and the main security controller in a home will likely continue to operate on backup power for a specified amount of time. Typical wireless security systems may continue to work during power outages, drawing their power from battery backup for several hours. Voice over Internet Protocol (VoIP) home security systems are generally vulnerable to power outages. While they do include battery backup, should a power outage also result in an Internet outage, these types of systems can stop communicating with monitoring centers. Internet-based home security systems are typically the most vulnerable in power outages, as a loss of power usually results in an Internet outage as well. Without an Internet connection to a monitoring center, these types of systems stop communication until power is restored and the Internet is up and running.

BRIEF SUMMARY

Implementations of the disclosed subject matter provide a smart home environment to detect when a controller of the security system may be uncoupled from one or more components of the system, including being unplugged from a power source, and determine when a power failure other loss of power occurs. Implementations of the disclosed subject matter may determine when a controller of the smart home environment is decoupled from a power converter, or when a power converter is decoupled from a power source, or when there is a loss of power. That is, the systems of the disclosed subject matter may distinguish between when a cable connecting the controller with a power converter is disconnected, when a cable connecting a power converter with a power source is disconnected, and when there is a loss of power (e.g., the power source is unable to provide power).

According to an implementation of the disclosed subject matter, a security system is provided that includes a controller to control an output of a notification when a condition is determined based on at least one signal received by the controller. The system may include a power converter coupled to a power source to convert power received by the power source for the controller, and a cable having at least one connector that includes a plurality of pins. The cable may be coupled between the power converter and the controller, and may provide the converted power via a power pin and the at least one signal via an identification pin to the controller. The controller may be configured to determine that there is a power outage with the power supply or that the power converter is disconnected from the power source based on a detected output level of the at least one signal and outputs the notification.

According to an implementation of the disclosed subject matter, a method is provided that includes controlling, at a controller, an output of a notification when a condition is determined based on at least one signal received by the controller. The method may include converting, at a power converter coupled to a power source, power received by the power source for the controller. The method may include coupling, at a cable having at least one connector that includes a plurality of pins, the power converter and the controller together, and providing the converted power via a power pin and the at least one signal via an identification pin to the controller. The method may include outputting, at the controller, the notification based on a determination that there is a power outage with the power supply or that the power converter is disconnected from the power source based on a detected output level of the at least one signal.

According to an implementation of the disclosed subject matter, means for detecting cable connectivity in a smart home environment are provided, including controlling, at a controller, an output a notification when a condition is determined based on at least one signal received by the controller. The means include converting, at a power converter coupled to a power source, power received by the power source for the controller. The means include coupling, at a cable having at least one connector that includes a plurality of pins, the power converter and the controller together, and providing the converted power via a power pin and the at least one signal via an identification pin to the controller. The means include outputting, at the controller, the notification based on a determination that there is a power outage with the power supply or that the power converter is disconnected from the power source based on a detected output level of the at least one signal.

Additional features, advantages, and implementations of the disclosed subject matter may be set forth or apparent from consideration of the following detailed description, drawings, and claims. Moreover, it is to be understood that both the foregoing summary and the following detailed description are illustrative and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate implementations of the disclosed subject matter and together with the detailed description serve to explain the principles of implementations of the disclosed subject matter. No attempt is made to show structural details in more detail than may be necessary for a fundamental understanding of the disclosed subject matter and various ways in which it may be practiced.

DETAILED DESCRIPTION

Implementations of the disclosed subject matter provide systems and methods of determining whether a cable is physically connected to a controller of a smart home environment. The cable may provide power to and/or may communicate data between a controller of a smart home environment and a power converter. The power converter may convert power that is received from a power source and provide it to the controller.

A sensor (e.g., an accelerometer) may be used to detect if the controller or the power converter is moved. Systems and methods using an accelerometer may detect motion without regard to whether a cable is decoupled from the controller and/or the power converter. Alternatively, a controller may periodically transmit a signal to the power converter so as to poll whether it is still connected and/or to determine a power loss. However, the polling may not distinguish between the power converter being decoupled from the controller, the power converter being decoupled from a power source, or a power failure.

Implementations of the disclosed subject matter may use a pin of a cable that couples a controller with the power converter to determine whether the controller is decoupled from the power converter, whether the power converter is decoupled from the power source, or whether there is a power outage such that the power source does not provide power. A pull-up resistor in a cable interface of the controller may pull the pin of the cable (and/or a receiving portion of the pin at the cable interface) to a predetermined high output level and the signal may be tied to ground at the power converter. When there is a power outage (e.g., such that the power source may not provide power to the power converter) or the cable between the power source and the power converter is uncoupled, the pin (e.g., in the cable interface of the controller) may have a predetermined low output level. When the cable is decoupled from at least one of the controller and the power converter, the pin may be pulled (e.g., in the cable interface of the controller) so as to output a predetermined high output value a cable interface of the controller.

Figure 1:
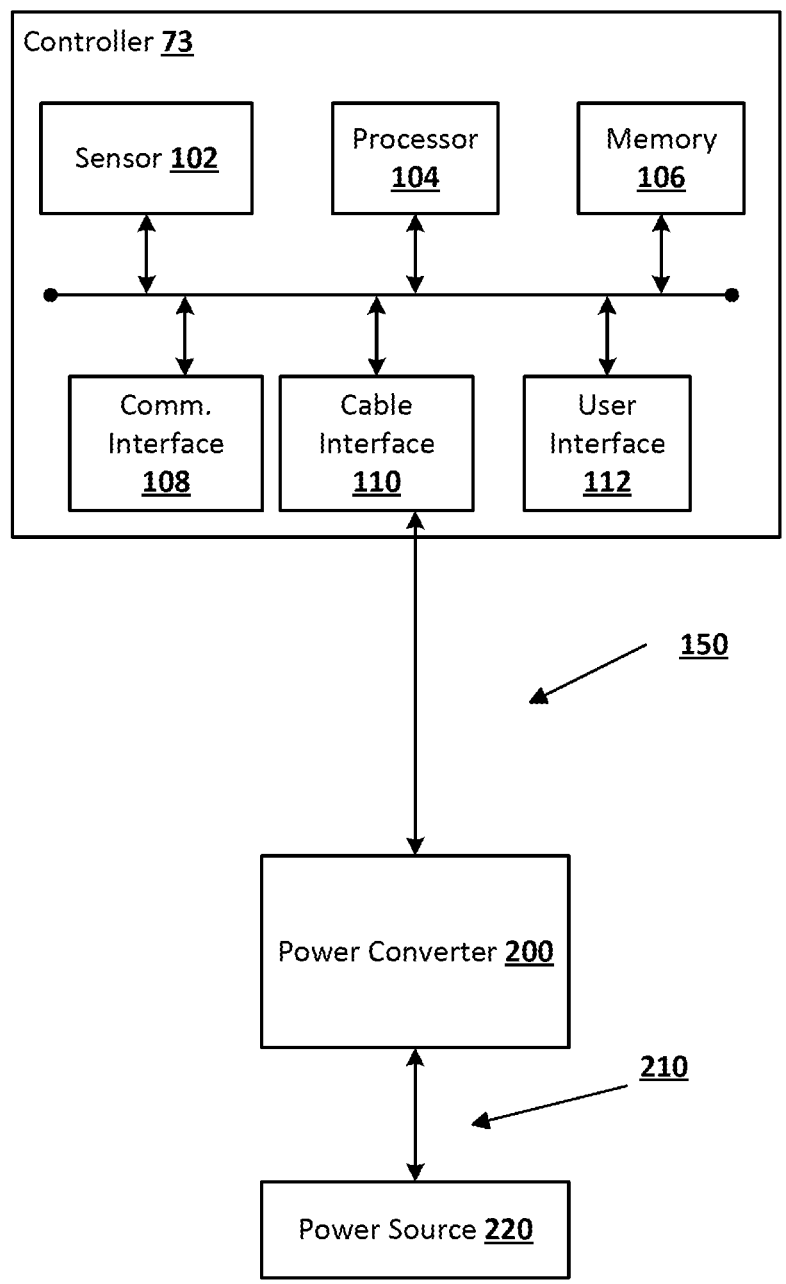
FIGS. 1, 1A, and 1B show a system to determine cable connectivity in a security system according to an implementation of the disclosed subject matter.
Figure 1A:
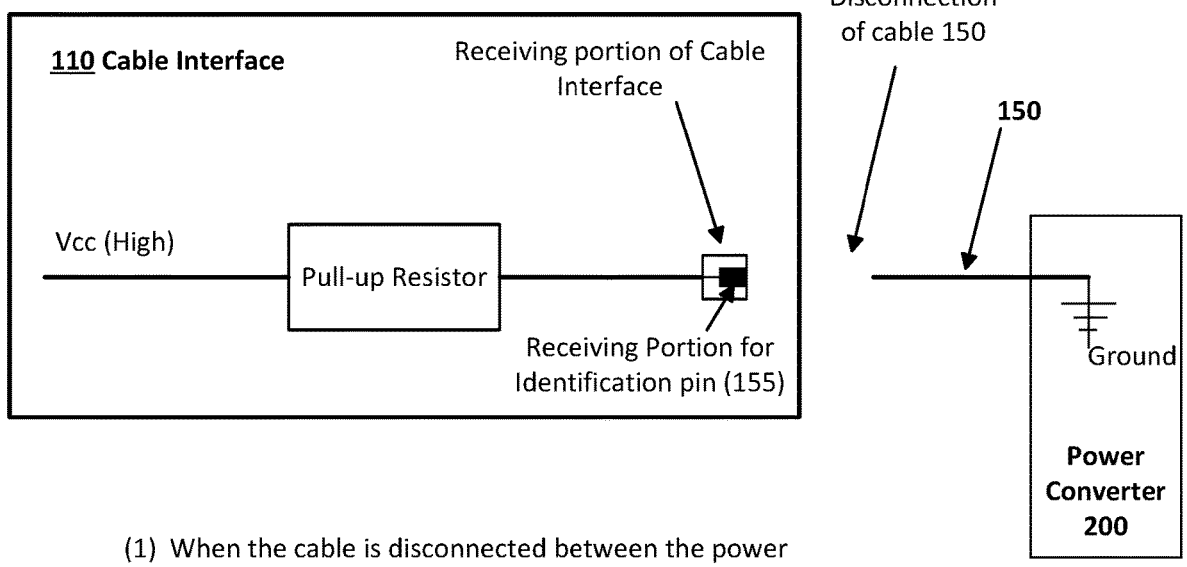
Figure 1B:
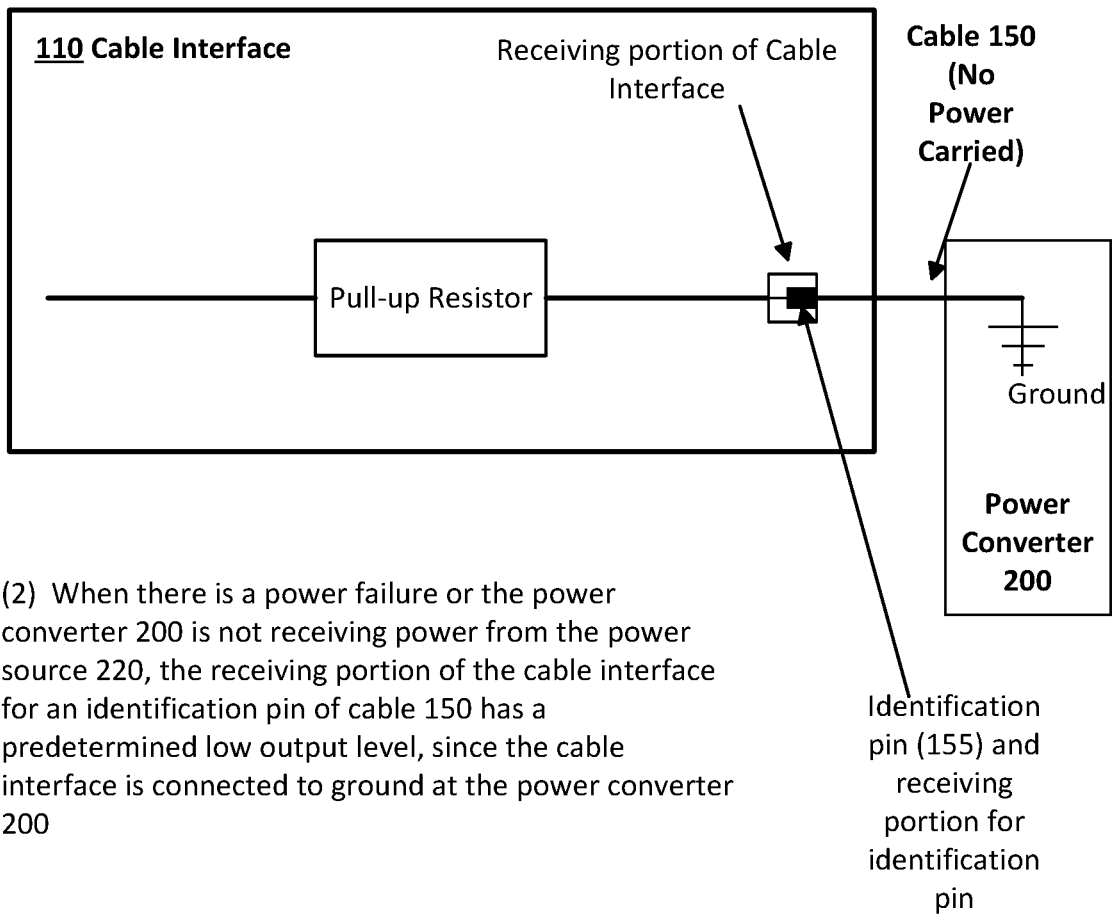
Figure 3:
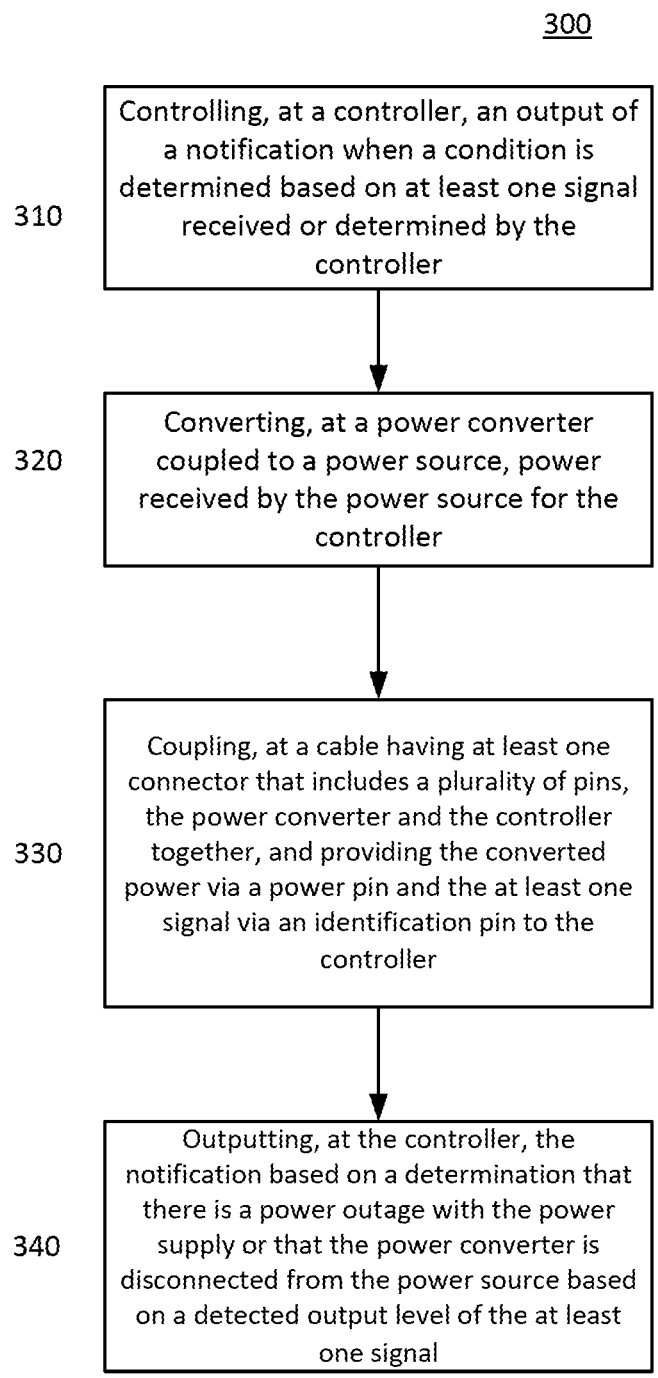
FIG. 3 shows example operations of a method according to an implementation of the disclosed subject matter.
Figure 4:
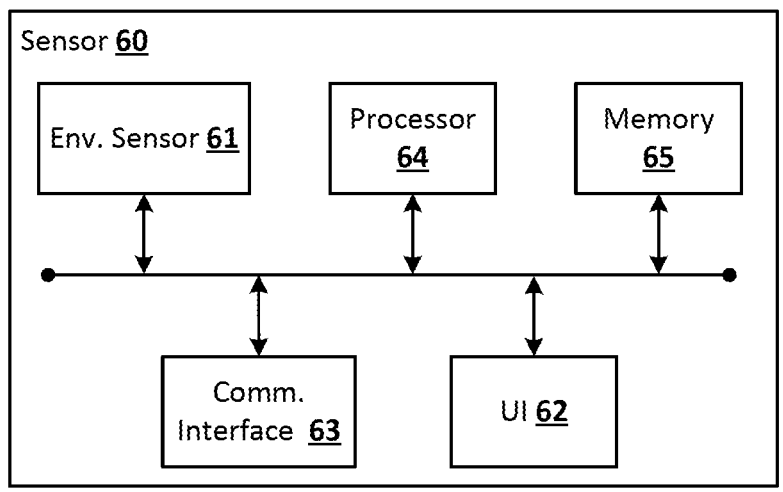
FIG. 4 shows an example sensor according to an implementation of the disclosed subject matter.

FIG. 1 shows a system 100 to determine cable connectivity in a security system of a smart home environment according to an implementation of the disclosed subject matter. System 100 may be part of a smart home environment (e.g., as shown in FIGS. 3-5). System 100 may include a controller 73 having at least one sensor 102, a processor 104, a memory 106, a communication interface 108, a cable interface 110 (e.g. as shown in FIGS. 1, 1A, and 1B), and/or a user interface 112. The controller 73 may control the system 100 and/or the smart home environment shown in FIGS. 3-5. The controller may be communicatively coupled to the power converter 200 by cable 150. The cable 150 may be configured to transmit power and/or data. The power converter 200 may receive power via cable 210 from power source 210. In some implementations, the power source 220 may be an alternating current (A/C) power source, and the power converter 200 may convert the alternating current power source to direct current (D/C) power to be provided to the controller 73 via the cable 150.

In some implementations, the controller 73 may be powered by a battery backup power supply (not shown) when a power failure is detected by the controller 73, and/or when it is detected that the controller 73 is decoupled from the power converter 200 (e.g., the cable 150 is disconnected from at least one of the controller 73 and/or the power converter 200, and/or the cable 210 is disconnected from at least one of the power converter 200 and/or the power source 220).

The sensor 102 may be a device to detect motion, smoke, carbon monoxide, carbon dioxide, laser, sound, proximity, temperature, time, physical orientation, acceleration, location, entry, presence, and the like. In some implementations, the sensor 102 may include, for example, a camera, a retinal camera, and/or a microphone. In some implementations, the sensor 102 may detect whether the cable 150 is coupled to the cable interface 110 of the controller 73.

The processor 104 may control the operation of sensor 102, memory 106, communication interface 108, cable interface 110, and/or user interface 112. The processor 104 may be a controller, a microprocessor, an integrated circuit, a field programmable gate array, a programmable logic device, or the like. The processor 104 may execute instructions stored on a computer-readable memory 106. The memory 106 or another memory in the sensor 60 may also store environmental data obtained by the sensor 102.

The communication interface 108, such as a Wi-Fi or other wireless interface, Ethernet or other local network interface, or the like may allow for communication by the controller 73 with other devices of the smart home environment (e.g., communication with network 70, sensors 71, 72, remote system 74, and the like).

The cable interface 110 may receive and/or communicate with the one of more pins (e.g., pins 152, 153, 154, 155, 156, or the like shown in FIG. 2) of cable 150. In some implementations, the cable 150 may be coupled to the cable interface 110. In some implementations, the cable interface 110 may include a pull-up resistor as shown in FIG. 1A and FIG. 1B. When the cable 150 is coupled between the cable interface 110 and the power converter 200, the pull-up resistor may pull a signal of one of the pins (e.g., pin 155, shown in FIG. 2) of the cable to a predetermined high output value, and the signal may be tied to ground at the power converter 200. As described in detail below in connection with FIG. 3, when there is a power outage or the cable 210 is unplugged (e.g., from at least one of the controller 73 and/or the power converter 200), a signal of one of the pins may have a predetermined low output value (e.g., ground (low) as shown in FIG. 1B). When the cable 150 is disconnected from at least one of the controller 73 and/or the power converter 200, the pull-up resistor may pull a signal of one of the pins to a predetermined high output level (e.g., Vcc (high) shown in FIG. 1A).

A user interface (UI) 112 may provide information (e.g., via a display device or the like) and/or receive input from a user (e.g., via a touchscreen, a keypad, or the like). The UI 112 may include, for example, a speaker to output an audible alarm and/or message when an event is detected (e.g., by sensor 102 and/or received via network 70 from sensor 71, 72 shown in FIG. 4A).

Figure 2:
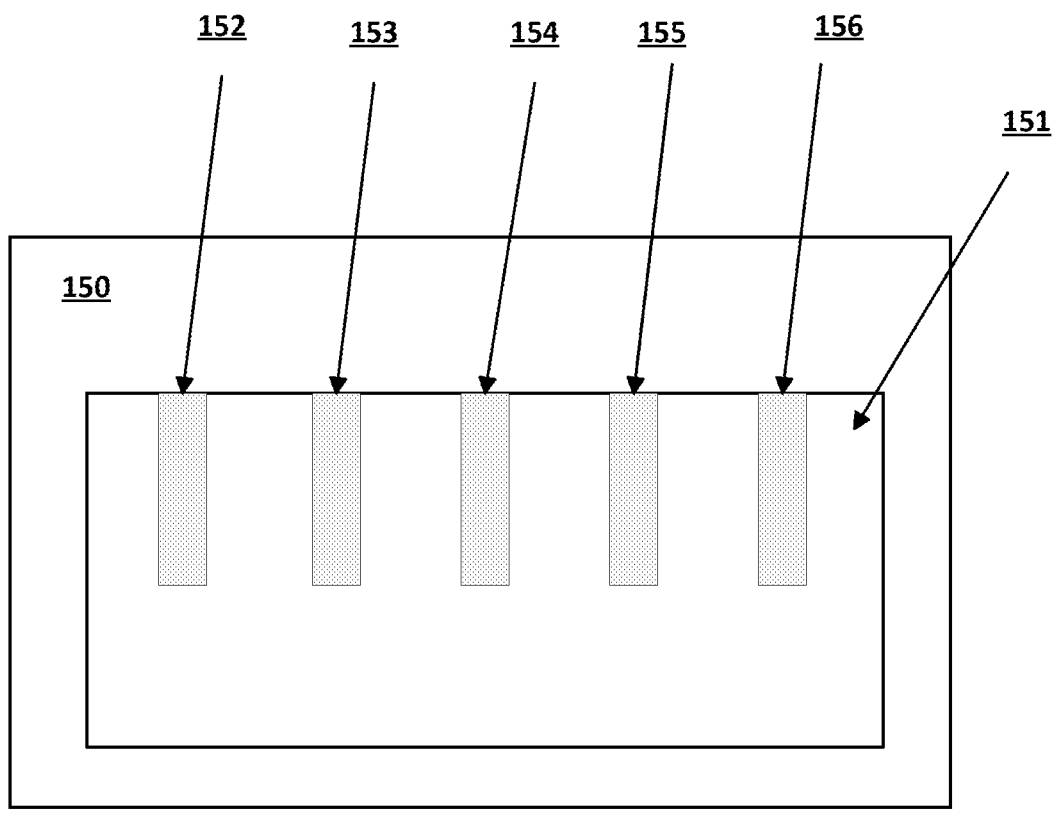
FIG. 2 shows a connecter portion of a cable of the security system according to an implementation of the disclosed subject matter.

FIG. 2 shows a connecter portion 151 of the cable 150 of the system 100 shown in FIG. 1 according to an implementation of the disclosed subject matter. Connecter portion 151 may be coupled to the cable interface 110 of the controller 73. The connecter portion 151 may include a plurality of pins, such as pins 152, 153, 154, 155, and/or 156. One or more of the plurality of pins 152, 153, 154, 155, and/or 156 may be coupled to the cable interface 110 so as to provide power to the controller 73 from the power converter 200, and/or to provide data, and/or to provide identification information. In some implementations, pin 152 may provide a voltage (Vcc) to controller 73 via the cable interface 110. For example, the pin 152 may provide +5 VDC. The pin 153 may transmit data (D−), and pin 154 may also transmit data (D+). Pin 155 may provide an identification signal (ID), so that the controller 73 may identify the communicatively coupled device (e.g., the power converter 200). The cable 150 may be a micro USB cable, and the pin 155 may be typically used as an identification pin. In implementations of the disclosed subject matter, the pin 155 may be used by the controller 73 to determine whether the cable 150 is connected or disconnected from either the controller 73 and/or the power converter 200, rather than for identification. The pin 155 may be used by the controller 73 to determine whether the power converter 200 has been disconnected from the power source 220 (e.g., the cable 210 is not connected to the power source 220), and/or there is a power failure (e.g., no power is being provided by the power source 220). In some implementations, the pin 156 shown in FIG. 2 may be a ground pin (GND).

FIG. 3 shows example operations of a method 300 according to an implementation of the disclosed subject matter. At operation 310, the controller 73 may control an output of a notification when a condition is determined based on at least one signal received and/or determined by the controller 73. For example, the controller may receive a signal and/or data via the cable 150 (e.g., pull a signal in the cable interface 110 to a predetermined high value or a predetermined low value with a pull-up resistor), and may output a notification (e.g., to the user interface 112 and/or may be transmitted to device 75 shown in FIG. 5B and FIG. 7 for output) that the cable 150 is disconnected, that there is a power failure, and/or that the power converter 200 is not connected to the power source 220 (e.g., by cable 210) based at least in part on one or more signals received and/or determined by the controller 73 (e.g., a signal having predetermined high output level or a predetermined low output level at the cable interface 110). In another example, the controller may output a notification based on an input received by the sensor 102 in the controller 73. In some implementations, the sensor 102 may determine that the cable 150 may be disconnected from the controller 73. As discussed below in connection with FIGS. 4-7, the controller 73 may receive one or more signals from sensors 71, 72, and/or remote system 74, and may output a notification and/or alert via the user interface 112 and/or may transmit the notification via the communication interface 108 to device 75.

At operation 320, the power converter 200 may convert power received by the power source 220 via cable 210 for the controller 73. For example, the power source 220 may be an A/C power source. When the cable 210 is coupled between the power source 22 and the power converter 200, the power converter 200 may convert the A/C power into D/C power. The converted power may be provided by the power converter 200 to the controller 73 via the cable 150, when the power converter 200 to the controller 73 are coupled via the cable 150. In some implementations, the pin 152 of cable 150 may provide +5 VDC from the power converter 200 to the controller 73.

At operation 330, the power converter 200 and the controller 73 may be coupled together by the cable 150 having at least one connector 151 that includes a plurality of pins (e.g., pins 152, 153, 154, 155, and/or 156), and the power converter 200 providing the converted power via a power pin (e.g., pin 152) and a signal (e.g., an identification signal) via an identification pin (e.g., pin 155) to the controller 73.

At operation 340, the controller 73 may output (e.g., via the communication interface 108 and/or the user interface 112) the notification based on a determination that there is a power outage with the power supply. The notification may be output based on a determination that the power converter 200 is disconnected from the power source 220 based on a detected output level of the identification signal. That is, based on the determination, the notification may be different, based on whether there is a power outage or the power converter is disconnected. The notification may notify the user which condition has been determined.

When the cable 150 is coupled to the controller 73 and the power converter 200, a pull-up resistor of the cable interface 110 may pull the identification pin (e.g., pin 155 of the cable 150) to a predetermined high output level. That is, the processor 104 may determine that the controller 73 and the power converter 200 are connected, and that power is being received (e.g., from the power source 220 via the power converter 220).

The controller 73 may determine that there is a power outage (e.g., power source 220 may be unable to provide power to the power converter 200 when the power converter 200 and the power source 220 are coupled via the cable 210) when at least one pin of the plurality of pins of the cable indicates a loss of power where the identification pin is pulled so as to output a predetermined low output level (e.g., the pull-up resistor of the cable interface 110 pulls the signal to the predetermined low output level). The controller 73 may output a notification via the communication interface 108 and/or the user interface 112 when the power outage (e.g., loss of power to the power source 220) is determined. For example, the controller 73 may output a notification via the communication interface 108 to a device 75 (shown in FIGS. 5B and 7).

The controller 73 may determine that the power converter 200 is disconnected from the power source 220 (e.g., the cable 210 is disconnected) when at least one pin (e.g., pin 155) of the plurality of pins (e.g., pins 152, 153, 154, and/or 155) of the cable 150 indicates a loss of power. That is, the identification pin (e.g., pin 15) may be pulled by the pull-up resistor of the cable interface 110 so as to output a predetermined low output level when there is a loss of power because a cable is disconnected form the power source (e.g., when cable 210 is disconnected between the power converter 200 and the power source 220). The controller 73 may output a notification via the communication interface 108 and/or the user interface 112 when the cable 210 is disconnected (e.g., from the power source 220 and/or the power converter 200).

In some implementations of the disclosed subject matter, the identification pin at the cable interface 110 may be set and/or pulled so as to output a predetermined high output level (e.g., the pin 155 may be set by the controller 73, and/or may output the predetermined high output level by the pull-up resistor) when the cable 150 is disconnected from the controller 73 and/or the power converter 200.

In some implementations of the disclosed subject matter, when the cable 150 is disconnected between the power converter 200 and the controller 73, a pull-up resistor of a cable interface 110 of the controller 73 may pull the identification pin (e.g., pin 155) to a predetermined high output level.

Implementations of the system shown in FIGS. 1-2, which may be part of a smart home environment shown in FIGS. 4-7, may use one or more sensors. In general, a "sensor" may refer to any device that can obtain information about its environment. Sensors may be described by the type of information they collect. For example, sensor types as disclosed herein may include motion, smoke, carbon monoxide, carbon dioxide, laser, sound, proximity, temperature, time, physical orientation, acceleration, location, entry, presence, and the like. A sensor can include, for example, a camera, a retinal camera, and/or a microphone.

A sensor also may be described in terms of the particular physical device that obtains the environmental information. For example, an accelerometer may obtain acceleration information, and thus may be used as a general motion sensor and/or an acceleration sensor. A sensor also may be described in terms of the specific hardware components used to implement the sensor. For example, a temperature sensor may include a thermistor, thermocouple, resistance temperature detector, integrated circuit temperature detector, or combinations thereof. A sensor also may be described in terms of a function or functions the sensor performs within an integrated sensor network, such as a smart home environment as disclosed herein. For example, a sensor may operate as a security sensor when it is used to determine security events such as unauthorized entry. A sensor may operate with different functions at different times, such as where a motion sensor is used to control lighting in a smart home environment when an authorized user is present, and is used to alert to unauthorized or unexpected movement when no authorized user is present, or when an alarm system is in an "armed" state, or the like. In some cases, a sensor may operate as multiple sensor types sequentially or concurrently, such as where a temperature sensor is used to detect a change in temperature, as well as the presence of a person or animal. A sensor also may operate in different modes at the same or different times. For example, a sensor may be configured to operate in one mode during the day and another mode at night. As another example, a sensor may operate in different modes based upon a state of a home security system or a smart home environment, or as otherwise directed by such a system.

In general, a "sensor" as disclosed herein may include multiple sensors or sub-sensors, such as where a position sensor includes both a global positioning sensor (GPS) as well as a wireless network sensor, which provides data that can be correlated with known wireless networks to obtain location information. Multiple sensors may be arranged in a single physical housing, such as where a single device includes movement, temperature, magnetic, and/or other sensors. Such a housing also may be referred to as a sensor or a sensor device. For clarity, sensors are described with respect to the particular functions they perform and/or the particular physical hardware used, when such specification is necessary for understanding of the implementations disclosed herein.

A sensor may include hardware in addition to the specific physical sensor that obtains information about the environment. FIG. 4 shows an example sensor as disclosed herein that me be part of the smart home environment shown in FIGS. 5A-7. The sensor 60 may include an environmental sensor 61, such as a temperature sensor, smoke sensor, carbon monoxide sensor, motion sensor, accelerometer, proximity sensor, passive infrared (PIR) sensor, magnetic field sensor, radio frequency (RF) sensor, light sensor, humidity sensor, or any other suitable environmental sensor, that obtains a corresponding type of information about the environment in which the sensor 60 is located. A processor 64 may receive and analyze data obtained by the sensor 61, control operation of other components of the sensor 60, and process communication between the sensor and other devices. The processor 64 may execute instructions stored on a computer-readable memory 65. The memory 65 or another memory in the sensor 60 may also store environmental data obtained by the sensor 61. A communication interface 63, such as a Wi-Fi or other wireless interface, Ethernet or other local network interface, or the like may allow for communication by the sensor 60 with other devices (e.g., the controller 73 via a network 70).

A user interface (UI) 62 may provide information (e.g., via a display device or the like) and/or receive input from a user of the sensor. The UI 62 may include, for example, a speaker to output an audible alarm and/or message when an event is detected by the sensor 60. The speaker may output a message to an authorized user regarding the operational status (e.g., there are no security and/or environmental events, an operational issue has been detected, and/or a security event and/or environmental event has been detected) of the security system disclosed herein, when, for example, the user arrives at the building (e.g., the user's home, the user's office, or the like), or when the user exits the building. The speaker may output an audible message for a user to access information regarding the operational status of the security system, for example, when the user arrives at the building (e.g., a home, an office, or the like) via an application installed and/or accessible from an electronic device (e.g., device 75 illustrated in FIG. 5B and/or in FIG. 7). Alternatively, or in addition, the UI 62 may include a light to be activated when an event is detected by the sensor 60. The UI 62 may be relatively minimal, such as a limited-output display, or it may be a full-featured interface such as a touchscreen.

Components within the sensor 60 may transmit and receive information to and from one another via an internal bus or other mechanism as will be readily understood by one of skill in the art. One or more components may be implemented in a single physical arrangement, such as where multiple components are implemented on a single integrated circuit. Sensors as disclosed herein may include other components, and/or may not include all of the illustrative components shown.

Sensors as disclosed herein may operate within a communication network (e.g., network 70 shown in FIGS. 5A-6), such as a conventional wireless network, and/or a sensor-specific network through which sensors may communicate with one another and/or with dedicated other devices. In some configurations, one or more sensors may provide information to one or more other sensors, to a central controller (e.g., controller 73), or to any other device capable of communicating on a network with the one or more sensors. A central controller may be general- or special-purpose. For example, one type of central controller may be part of a home automation network that collects and analyzes data from one or more sensors within the home. Another example of a central controller is a special-purpose controller that is dedicated to a subset of functions, such as a security controller that collects and analyzes sensor data primarily or exclusively as it relates to various security considerations for a location. A central controller may be located locally with respect to the sensors with which it communicates and from which it obtains sensor data, such as in the case where it is positioned within a home that includes a home automation and/or sensor network. Faults and/or other issues with sensors may be reported to the central controller. If the communications network that the sensors and the central controller are part of experiences connectivity issues, data to authenticate users so as to allow entry, and/or arming and/or disarming of the security system may be stored at individual sensors that may serve as access points to the home and/or building. Alternatively or in addition, a central controller as disclosed herein may be remote from the sensors, such as where the central controller is implemented as a cloud-based system that communicates with multiple sensors, which may be located at multiple locations and may be local or remote with respect to one another.

Figure 5A:
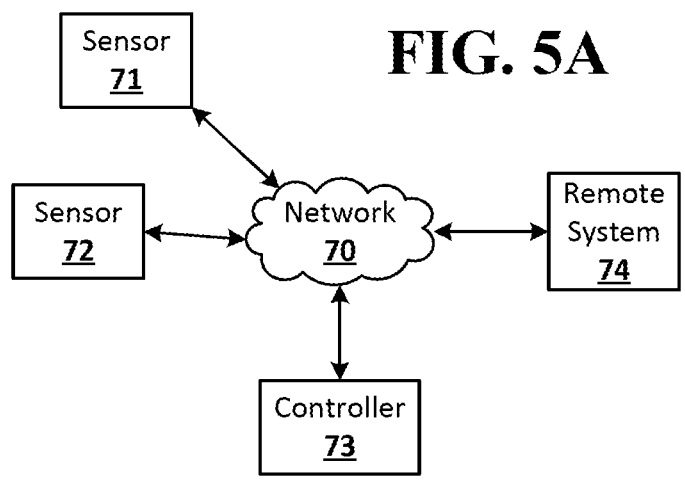
FIGS. 5A-5B show a security system having a sensor network according implementations of the disclosed subject matter.
Figure 5B:
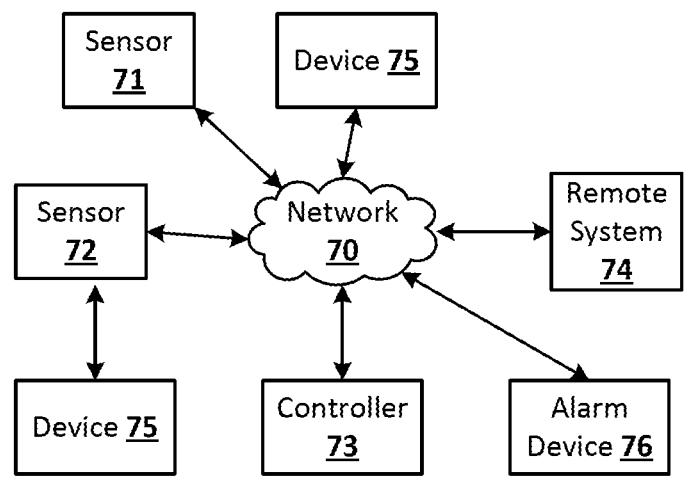

FIGS. 5A-5B show examples of a smart home environment having a sensor network as disclosed herein, which may be implemented over any suitable wired and/or wireless communication networks. One or more sensors 71, 72 may communicate via a local network 70, such as a Wi-Fi or other suitable network, with each other and/or with a controller 73.

FIGS. 5A-5B show an example of a smart home environment (e.g., which may include a security system) as disclosed herein, which may be implemented over any suitable wired and/or wireless communication networks. One or more sensors 71, 72 may communicate via a local network 70, such as a Wi-Fi or other suitable network, with each other and/or with a controller 73. The devices of the smart home environment of the disclosed subject matter may be communicatively connected via the network 70, which may be a mesh-type network such as Thread, which provides network architecture and/or protocols for devices to communicate with one another. Typical home networks may have a single device point of communications. Such networks may be prone to failure, such that devices of the network cannot communicate with one another when the single device point does not operate normally. The Thread mesh-type network of Thread, which may be used in the security system of the disclosed subject matter, may avoid communication using a single device. That is, in the mesh-type network, such as network 70, there is no single point of communication that may fail so as to prohibit devices coupled to the network from communicating with one another.

The communication and network protocols used by the devices communicatively coupled to the network 70 may provide secure communications, minimize the amount of power used (i.e., be power efficient), and support a wide variety of devices and/or products in a home, such as appliances, access control, climate control, energy management, lighting, safety, and security. For example, the protocols supported by the network and the devices connected thereto may have an open protocol which may carry IPv6 natively.

The Thread network, such as network 70, may be easy to set up and secure to use. The network 70 may use an authentication scheme, AES (Advanced Encryption Standard) encryption, or the like to reduce and/or minimize security holes that exist in other wireless protocols. The Thread network may be scalable to connect devices (e.g., 2, 5, 10, 20, 50, 100, 150, 200, or more devices) into a single network supporting multiple hops (e.g., so as to provide communications between devices when one or more nodes of the network is not operating normally). The network 70, which may be a Thread network, may provide security at the network and application layers. One or more devices communicatively coupled to the network 70 (e.g., controller 73, remote system 74, and the like) may store product install codes to ensure only authorized devices can join the network 70. One or more operations and communications of network 70 may use cryptography, such as public-key cryptography.

The devices communicatively coupled to the network 70 of the smart home environment and/or security system disclosed herein may feature low power consumption and/or reduced power consumption. That is, devices efficiently communicate to and with one another and operate to provide functionality to the user, where the devices may have reduced battery size and increased battery lifetimes over conventional devices. The devices may include sleep modes to increase battery life and reduce power requirements. For example, communications between devices coupled to the network 70 may use the power-efficient IEEE 802.15.4 MAC/PHY protocol. In implementations of the disclosed subject matter, short messaging between devices on the network 70 may conserve bandwidth and power. The routing protocol of the network 70 may reduce network overhead and latency. The communication interfaces of the devices coupled to the smart home environment may include wireless system-on-chips to support the low-power, secure, stable, and/or scalable communications network 70.

The controller 73 shown in FIGS. 5A-5B may be communicatively coupled to the network 70 and may be and/or include a processor. Alternatively, or in addition, the controller 73 may be a general- or special-purpose computer. The controller 73 may, for example, receive, aggregate, and/or analyze environmental information received from the sensors 71, 72. The sensors 71, 72 and the controller 73 may be located locally to one another, such as within a single dwelling, office space, building, room, or the like, or they may be remote from each other, such as where the controller 73 is implemented in a remote system 74 such as a cloud-based reporting and/or analysis system. Alternatively or in addition, sensors 71, 72 may communicate directly with a remote system 74. The remote system 74 may, for example, aggregate data from multiple locations, provide instruction, software updates, and/or aggregated data to a controller 73 and/or sensors 71, 72.

The sensor network shown in FIGS. 5A-5B may be an example of a smart home environment. The depicted smart home environment may include a structure, a house, office building, garage, mobile home, or the like. The devices of the smart home environment, such as the sensors 71, 72, the controller 73, and the network 70 may be integrated into a smart home environment that does not include an entire structure, such as an apartment, condominium, or office space.

The smart home environment can control and/or be coupled to devices outside of the structure. For example, one or more of the sensors 71, 72 may be located outside the structure, for example, at one or more distances from the structure (e.g., sensors 71, 72) may be disposed outside the structure, at points along a land perimeter on which the structure is located, and the like. One or more of the devices in the smart home environment need not physically be within the structure. For example, the controller 73 which may receive input from the sensors 71, 72 may be located outside of the structure.

The structure of the smart home environment may include a plurality of rooms, separated at least partly from each other via walls. The walls can include interior walls or exterior walls. Each room can further include a floor and a ceiling. Devices of the smart home environment, such as the sensors 71, 72, may be mounted on, integrated with and/or supported by a wall, floor, or ceiling of the structure.

The smart home environment including the sensor network shown in FIGS. 5A-5B may include a plurality of devices, including intelligent, multi-sensing, network-connected devices, that can integrate seamlessly with each other and/or with a central server or a cloud-computing system (e.g., controller 73 and/or remote system 74) to provide home-security and smart home features. The smart home environment may include one or more intelligent, multi-sensing, network-connected thermostats (e.g., "smart thermostats"), one or more intelligent, network-connected, multi-sensing hazard detection units (e.g., "smart hazard detectors"), and one or more intelligent, multi-sensing, network-connected entryway interface devices (e.g., "smart doorbells"). The smart hazard detectors, smart thermostats, and smart doorbells may be the sensors 71, 72 shown in FIGS. 5A-5B.

For example, a smart thermostat may detect ambient climate characteristics (e.g., temperature and/or humidity) and may control an HVAC (heating, ventilating, and air conditioning) system accordingly of the structure. For example, the ambient client characteristics may be detected by sensors 71, 72 shown in FIGS. 5A-5B, and the controller 73 may control the HVAC system (not shown) of the structure.

As another example, a smart hazard detector may detect the presence of a hazardous substance or a substance indicative of a hazardous substance (e.g., smoke, fire, or carbon monoxide). For example, smoke, fire, and/or carbon monoxide may be detected by sensors 71, 72 shown in FIGS. 5A-5B, and the controller 73 may control an alarm system to provide a visual and/or audible alarm to the user of the smart home environment.

As another example, a smart doorbell may control doorbell functionality, detect a person's approach to or departure from a location (e.g., an outer door to the structure), and announce a person's approach or departure from the structure via audible and/or visual message that is output by a speaker and/or a display coupled to, for example, the controller 73.

In some implementations, the smart home environment of the sensor network shown in FIGS. 5A-5B may include one or more intelligent, multi-sensing, network-connected wall switches (e.g., "smart wall switches"), one or more intelligent, multi-sensing, network-connected wall plug interfaces (e.g., "smart wall plugs"). The smart wall switches and/or smart wall plugs may be or include one or more of the sensors 71, 72 shown in FIGS. 5A-5B. A smart wall switch may detect ambient lighting conditions, and control a power and/or dim state of one or more lights. For example, a sensor such as sensors 71, 72, may detect ambient lighting conditions, and a device such as the controller 73 may control the power to one or more lights (not shown) in the smart home environment. Smart wall switches may also control a power state or speed of a fan, such as a ceiling fan. For example, sensors 72, 72 may detect the power and/or speed of a fan, and the controller 73 may adjusting the power and/or speed of the fan, accordingly. Smart wall plugs may control the supply of power to one or more wall plugs (e.g., such that power is not supplied to the plug if nobody is detected to be within the smart home environment). For example, one of the smart wall plugs may control the supply of power to a lamp (not shown).

In implementations of the disclosed subject matter, a smart home environment may include one or more intelligent, multi-sensing, network-connected entry detectors (e.g., "smart entry detectors"). Such detectors may be or include one or more of the sensors 71, 72 shown in FIGS. 5A-5B. The illustrated smart entry detectors (e.g., sensors 71, 72) may be disposed at one or more windows, doors, and other entry points of the smart home environment for detecting when a window, door, or other entry point is opened, broken, breached, and/or compromised. The smart entry detectors may generate a corresponding signal to be provided to the controller 73 and/or the remote system 74 when a window or door is opened, closed, breached, and/or compromised. In some implementations of the disclosed subject matter, the alarm system, which may be included with controller 73 and/or coupled to the network 70 may not arm unless all smart entry detectors (e.g., sensors 71, 72) indicate that all doors, windows, entryways, and the like are closed and/or that all smart entry detectors are armed.

The smart home environment of the sensor network shown in FIGS. 5A-5B can include one or more intelligent, multi-sensing, network-connected doorknobs (e.g., "smart doorknob"). For example, the sensors 71, 72 may be coupled to a doorknob of a door (e.g., doorknobs 122 located on external doors of the structure of the smart home environment). However, it should be appreciated that smart doorknobs can be provided on external and/or internal doors of the smart home environment.

The smart thermostats, the smart hazard detectors, the smart doorbells, the smart wall switches, the smart wall plugs, the smart entry detectors, the smart doorknobs, the keypads, and other devices of a smart home environment (e.g., as illustrated as sensors 71, 72 of FIGS. 5A-5B can be communicatively coupled to each other via the network 70, and to the controller 73 and/or remote system 74 to provide security, safety, and/or comfort for the smart home environment).

A user can interact with one or more of the network-connected smart devices (e.g., via the network 70). For example, a user can communicate with one or more of the network-connected smart devices using a computer (e.g., a desktop computer, laptop computer, tablet, or the like) or other portable electronic device (e.g., a smartphone, smart watch, wearable computing device, a tablet, a key fob, a radio frequency and the like). A webpage and/or application can be configured to receive communications from the user and control the one or more of the network-connected smart devices based on the communications and/or configured to present information about the device's operation to the user. For example, the user can view the webpage and/or the application, and can arm or disarm the security system of the home.

One or more users can control one or more of the network-connected smart devices in the smart home environment using a network-connected computer or portable electronic device. In some examples, some or all of the users (e.g., individuals who live in the home) can register their mobile device and/or key fobs with the smart home environment (e.g., with the controller 73). Such registration can be made at a central server (e.g., the controller 73 and/or the remote system 74) to authenticate the user and/or the electronic device as being associated with the smart home environment, and to provide permission to the user to use the electronic device to control the network-connected smart devices and the security system of the smart home environment. A user can use their registered electronic device to remotely control the network-connected smart devices and security system of the smart home environment, such as when the occupant is at work or on vacation. The user may also use their registered electronic device to control the network-connected smart devices when the user is located inside the smart home environment.

Alternatively, or in addition to registering electronic devices, the smart home environment may make inferences about which individuals live in the home and are therefore users and which electronic devices are associated with those individuals. As such, the smart home environment may "learn" who is a user (e.g., an authorized user) and permit the electronic devices associated with those individuals to control the network-connected smart devices of the smart home environment (e.g., devices communicatively coupled to the network 70), in some implementations including sensors used by or within the smart home environment. The smart home environment may provide notifications to users when there is an attempt to use network-connected smart devices in a manner that is atypical from the learned pattern of usage. Various types of notices and other information may be provided to users via messages sent to one or more user electronic devices. For example, the messages can be sent via email, short message service (SMS), multimedia messaging service (MMS), unstructured supplementary service data (USSD), as well as any other type of messaging services and/or communication protocols.

A smart home environment may include communication with devices outside of the smart home environment but within a proximate geographical range of the home. For example, the smart home environment may include an outdoor lighting system (not shown) that communicates information through the communication network 70 or directly to a central server or cloud-computing system (e.g., controller 73 and/or remote system 74) regarding detected movement and/or presence of people, animals, and any other objects and receives back commands for controlling the lighting accordingly.

The one or more sensors 71, 72 shown in FIGS. 5A-5B may determine whether there is a power failure and/or power has been disconnected from one or more devices of the smart home environment (e.g., the controller 73 or the like). In another example, the sensors 71, 72 may be magnetic field sensors that detect a security event when a door and/or window of a building having the security system disclosed herein has been opened and/or compromised. In yet another example, the one or more sensors 71, 72 may be a smoke sensor and/or a carbon monoxide sensor that detect an environmental event when smoke is sensed and/or carbon monoxide is sensed.

In implementations of the disclosed subject matter, the remote system 74 shown in FIGS. 5A-5B may be a law enforcement provider system, a home security provider system, a medical provider system, and/or a fire department provider system. When a security event and/or environmental event is detected by at least one of one sensors 71, 72, a message may be transmitted to the remote system 74. The content of the message may be according to the type of security event and/or environmental event detected by the sensors 71, 72. For example, if a loss of power is detected, the smart home environment may operate via battery back-up, and the controller 73 may transmit a message to a law enforcement provider system and/or a home security provider system that a power failure has occurred or that a power supply to the controller 73 has been disconnected In another example, if smoke is detected by one of the sensors 71, 72, the controller 73 may transmit a message to the remote system 74 associated with a fire department to provide assistance with a smoke and/or fire event (e.g., request fire department response to the smoke and/or fire event). Alternatively, the sensors 71, 72 may generate and transmit the message to the remote system 74. In another example, when one of the sensors 71, 72 detects a security event, such a window or door of a building being compromised, a message may be transmitted to the remote system 74 associated with local law enforcement to provide assistance with the security event (e.g., request a police department response to the security event).

The controller 73 and/or the remote system 74 may include a display to present an operational status message (e.g., describing a power event, a security event, an environmental event, an operational condition, or the like), according to information received from at least one or the sensors 71, 72. For example, the display of the controller 73 may display the operational status message that the smart home environment is operating using a battery back-up because of a power failure and/or the controller 73 has been disconnected from a power converter and/or power supply. In another example, the display of the controller 73 and/or remote system 74 may display the operational status message to a user while the user is away from the building having the security system disclosed herein. Alternatively, or in addition, the controller 73 may display the operational status message to a user when the user arrives at and/or departs (i.e., exits) from the building. For example, one or more sensors may identify and authenticate the user (e.g., using images captured by the sensor, and comparing them with pre-stored images, and/or according to identifying information from the device of a user, such as a smartphone, smart watch, wearable computing device, key FOB, RFID tag, or the like), and the security system may display the operational status message.

FIG. 5B shows a security system as disclosed herein that includes an alarm device 76, which may include a light and an audio output device. The alarm device 76 may be controlled, for example, by controller 73. The light of the alarm device 76 may be activated so as to be turned on when one or more sensors 71, 72 detect a security event and/or an environmental event. Alternatively, or in addition, the light may be turned on and off in a pattern (e.g., where the light is turned on for one second, and off for one second; where the light is turned on for two seconds, and off for one second, and the like) when one or more sensors 71, 72 detect a security event and/or an environmental event. Alternatively, or in addition, an audio output device of the alarm device 76 may include at least a speaker to output an audible alarm when a security event and/or an environmental event is detected by the one or more sensors 71, 72. For example, a security event may be when one or more sensors 71, 72 are motion sensors that detect motion either inside a building having the security system disclosed herein, or within a predetermined proximity to the building. The speaker of the alarm device 76 may, for example, output a message when the user arrives at the building or departs from the building according to the operational status of the security system (e.g., a security and/or environmental event has been detected, an operational issue with the security system has been detected, the security system has been armed and/or disarmed, or the like). In another example, a security event may be when the cable 150 is unplugged from the controller 73 and/or the power converter 200.

Figure 7:
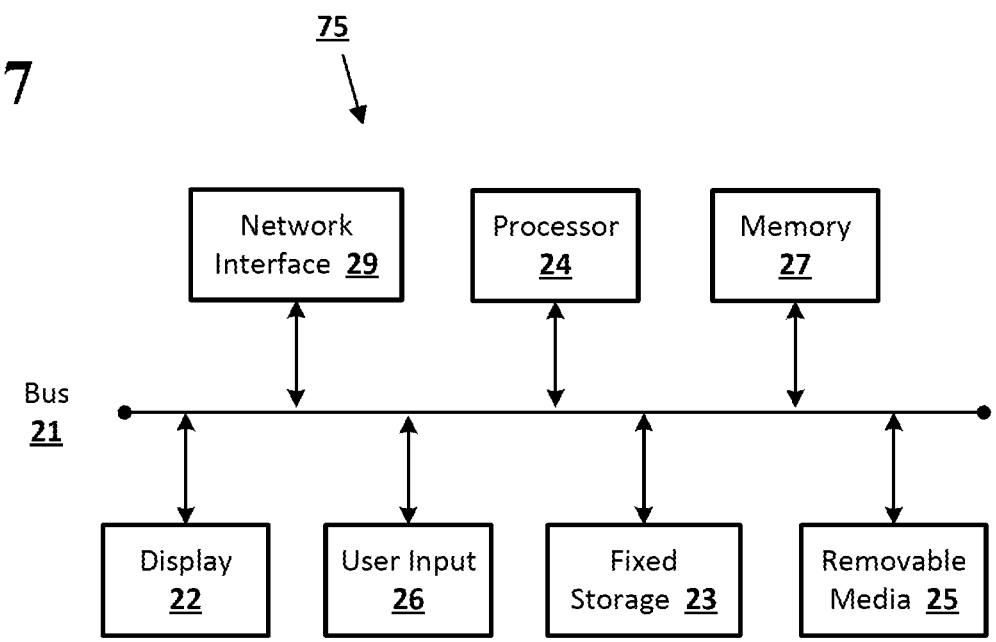
FIG. 7 shows an electronic device according to implementations of the disclosed subject matter.

FIG. 5B shows a device 75 that may be communicatively coupled to a sensor. Although FIG. 5B illustrates that device 75 is coupled to sensor 72, the device 75 may be communicatively coupled to sensor 71 and/or sensor 72. The device 75 may be a computing device as shown in FIG. 7 and described below, and/or a key FOB. A user of the security system disclosed herein may control the device 75. When the device 75 is within a predetermined distance (e.g., one foot, five feet, 10 feet, 20 feet, 100 feet, or the like) from the sensor 72, the device 75 and the sensor 72 may communicate with one another via Bluetooth signals, Bluetooth Low Energy (BTLE) signals, Wi-Fi pairing signals, near field communication (NFC) signals, radio frequency (RF) signals, infra-red signals, and/or short-range communication protocol signals. For example, the user may present the device 75 within the predetermined distance range of the sensor so that the device 75 and the sensor may communicate with one another. The device 75 may provide identifying information to the sensor 72, which may be provided to the controller 73 to determine whether the device 75 belongs to an authorized user of the security system disclosed herein. The controller 73 may monitor the location of the device 75 in order to determine whether to arm or disarm the alarm device 76. The controller 73 may arm or disarm the alarm device 76 according to, for example, whether the device 75 is within a home, building, and/or a predetermined area. The predetermined area may be defined, for example, according to, for example, geo-fencing data, placement and/or range of sensors 71, 72, a defined distance from the building having the security system disclosed herein, and the like.

In example implementations of the disclosed subject matter, the device 75 may be associated with an authorized user. Authorized users may be those users, for example, who have identifying information stored and/or registered with the controller 73. Identifying information may include, for example, images of the user, voice recordings of the user, identification codes that are stored in a user's device, user PIN codes, and the like.

For example, when the authorized user and the device 75 are outside of the home, building, and/or predetermined area, the controller 73 may arm the alarm device 76. In determining whether to arm the alarm device 76, the controller may gather data from the sensors 71, 72, to determine whether any other person is in the building. When the alarm device 76 is armed, and the user and the device 75 return to the home, building, and/or predetermined area of the security system, the controller 73 may disarm the alarm device 76 according to the signals received by the sensors 71, 72 from the device 75. The exchanged signals may include the identifying information of the user.

In FIGS. 5A-5B, the sensor 71, 72 may be a camera to capture an image of a face of a person to be transmitted to the controller 73, where the controller 73 compares the captured facial image with a pre-stored image. When it is determined by the controller 73 that at least a portion of the captured facial image matches the pre-stored image, the controller 73 determines that the person is an authorized user of the security system disclosed herein. The controller 73 may arm or disarm the alarm device 76 according to the determination of whether the person is an authorized user.

The sensor 71, 72 may be a camera to capture a retinal image from a person to be transmitted to the controller 73, where the controller 73 compares the captured retinal image with a pre-stored image. When it is determined by the controller 73 that at least a portion of the captured retinal image matches the pre-stored image, the controller 73 determines that the person is an authorized user of the security system disclosed herein. The controller 73 may arm or disarm the alarm device 76 according to the determination of whether the person is an authorized user.

The sensor 71, 72 may be a microphone to capture a voice of a person to be transmitted to the controller 73, where the controller 73 compares the captured voice with a pre-stored voice. When it is determined by the controller 73 that at least a portion of the captured voice matches the pre-stored voice, the controller 73 determines that the person is an authorized user of the security system disclosed herein.

When the sensor 72 and/or the controller 73 determine that the device 75 is associated with an authorized user according to the transmitted identification information, the sensor 72 and/or the controller 73 provide an operational status message to the user via a speaker (i.e., audio output 77), a display (e.g., where the display is coupled to the controller 73 and/or remote system 74), and/or the device 75. The operational status message displayed can include, for example, a message that a security event and/or environmental event has occurred (e.g., a power failure, the cable 150 has been disconnected from the controller 73, or the like). When the sensors 71, 72 have not detected a security and/or environmental event, a message may be displayed that no security and/or environmental event has occurred. In implementations of the subject matter disclosed herein, the device 75 may display a source of the security event and/or environmental event, a type of the security event and/or environmental event, a time of the security event and/or environmental event, and a location of the security event and/or environmental event.

In implementations of the disclosed subject matter, the device 75 may be communicatively coupled to the network 70 so as to exchange data, information, and/or messages with the sensors 71, 72, the controller 73, and the remote system 74.

In implementations of the disclosed subject matter, the controller 73 can request entry of an access code from the device 75 and/or a keypad communicatively coupled to the controller 73. Upon receipt of the access code, the security system disclosed herein may be disarmed, and/or may provide an operational status message to the user via a display coupled to the controller 73 and/or the device 75. Alternatively, or in addition, an operational status message may be output via a speaker of the alarm device 76.

As illustrated in FIGS. 5A-5B, a smart home environment can include sensors (e.g., sensors 71, 72) to detect a location of at least one user, and generate detection data according to the detected location of at least one user of the security system. The detection data may be generated by the sensors 71, 72. For example, the at least one user may be one or more members of a household, and the security system may monitor their location using the sensors 71, 72 to determine whether to arm or disarm the alarm device 76. A processor, such as the controller 73 illustrated in FIGS. 5A-5B and described above, may be communicatively coupled to the sensors 71, 72, and can receive the detection data. The controller 73 can determine whether the at least one user is occupying a home, building, and/or within a predetermined area according to the detection data. The predetermined area may be set according to the boundaries of a home or building, geofencing data, motion data, a door position event, a distance from one or more sensors, and the like. For example, the sensor be used in part to determine when the cable 150 is disconnected from the controller 73 and/or power converter 200, and may determine whether one or more persons were within a room and/or area where the controller 73 is located when the cable 150 was disconnected.

In some implementations, the sensors 71, 72 can detect a location of the user is outside of the home, building, and/or predetermined area, and that a user's first electronic device (e.g., a smartphone, smart watch, wearable computing device, or the like) is within the home, building, and/or predetermined area. The controller 73 can determine whether to arm the alarm device 76 according one a location of a user's second electronic device (e.g., a key FOB, RFID tag, fitness band or sensor, or the like), geofencing data, and the detection data from the sensors 71, 72.

The smart home environment disclosed herein may include an alarm device, such as the alarm device 76 illustrated in FIG. 5B and discussed above, which can be armed or disarmed by the controller 73 according to the determination as to whether the at least one user is occupying the home or building, and/or within the predetermined area.

For example, if the controller 73 determines that the members of a household (e.g., the users of the home security system) have exited the house (e.g., are no longer occupying the home or building, and are outside of the predetermined area), the controller 73 may arm the alarm device 76. After exiting, controller 73 may request confirmation from the user, via the device 75, to arm the alarm. The sensors 71, 72 may determine the location of the members of the household according to their respective electronic devices (e.g., smartphones, smart watch, wearable computing device, tablet computers, key fobs, RFID tag, fitness band or sensor, and the like), according to images captured by the sensors, according to the sensors detecting one or more doors opening and closing, and the like.

For example, the sensors 71, 72 may detect one or more doors opening and/or closing, the controller 73 may determine an approximate location of a user, according to the location of the sensor for the door, and what direction the door was opened and/or closed in. The data generated by the door sensors 71, 72 regarding the directional opening of the door, as well as the location of the sensor, may be used along with other sensor data from sensors 71, 72 (e.g., motion data, camera images, sound data, and/or thermal data, and the like) to provide an improved location determination of the user.

In some implementations, the sensors 71, 72, the sensor 102, and/or the cable interface 102 may determine that at least one end of the cable 150 has been disconnected from the controller 73 and/or the power converter 200, may determine that at least one end of cable 210 may be disconnected from the power converter 200 and/or the power source 220, and/or may detect a power failure at power source 220, and the alarm device 76 may output a notification (e.g., to the user interface 112 of the controller 73 and/or to a device 75) a visual alarm, and/or an audible alarm.

The controller 73 may aggregate detection data from the sensors 71, 72 and/or sensor 102 and store it in a storage device coupled to the controller 73 or the network 70. The data aggregated by the controller 73 may be used to determine entrance and exit patterns (e.g., what days and times users enter and exit from the house, what doors are used, and the like) of the members of the household, and the controller 73 may arm or disarm the alarm device 76 according to the determined patterns.

In implementations of the disclosed subject matter, one or more user electronic devices (e.g., device 75) can be registered with the controller 73, and the at least one of the sensors 71, 72 transmits a location request signal to the device 75. In response to the location request signal, the device 75 can transmits a location signal, and the controller 73 can determine the location of the device 75 according to the received location signal. The location request signal and the location signal can be Bluetooth signals, Bluetooth Low Energy (BTLE) signals, radio frequency (RF) signals, near field communications (NFC) signals, and the like.

The controller 73 can transmit a message to be displayed by the device 75. The message may be, for example, a reminder to arm or disarm the alarm device 76, a notification that the smart home environment is operating using battery backup, a notification that one or more cables have been disconnected such that the controller 73 is not receiving power from the power converter 200, a notification that a power failure has occurred, or the like. Upon displaying the message the electronic device receives input to arm or disarm the alarm device 76 according to the displayed request message, and transmits the received input to the controller 73 so as to control the alarm device 76. For example, the controller can request a code from the user to either arm or disarm the alarm device 76. When the user provides the code to the device 75, which correspondingly transmits the entered code to the controller 73, the controller 73 may control the arming or disarming of the alarm device 76. Alternatively, or in addition, the controller 73 can control the alarm device 76 to be automatically armed when the user is no longer occupying the home or building, and/or is outside of the predetermined area. Alternatively, or in addition, the controller may control the arming or disarming of the alarm device 76 according to a code that entered in a keypad that is communicatively coupled to the controller 73.

In implementations of the disclosed subject matter, authentication requirements for arming or disarming of the alarm device 76 may be reduced when a device 75 is used to arm or disarm, and the device 75 is a registered device. When a button on the registered device 75 or displayed by the device 75 is used to arm or disarm the alarm device 76, the user may not have to enter a code, a shortened PIN code, a voice code, or the like.

When the sensors 71, 72 for an entry door to the home or building become disconnected from the network 70 and the controller 73 and/or the controller 73 is not receiving power from the power converter 200 (e.g., is receiving power from a battery back-up) and the alarm device 76 is armed, the user may still re-enter the home. The security system may learn which doors are used by the user to enter and/or exit a home. The sensors 71, 72 associated with the doors that are used to enter and/or exit the home may store identifying information, so that the user may present a device 75 to the sensors 71, 72 to exchange identifying information to allow the user to enter the door. Once the user enters, the user may manually disarm the alarm device 76 by entering a security code.

The security system may learn the how the user typically arms and disarms the alarm device 76 (e.g., using a keypad, using the device 75, allowing for auto-arming, or the like). The device 75 may receive a message from the controller 73 when there is an attempt to disarm the alarm device 76 at a time of day and/or in a manner that is inconsistent with a user history or pattern for disarming. The controller 73 may request that the user of device 75 confirm whether the disarming is authorized, and may provide information from sensors 71, 72 (e.g., images captured of the person attempting the disarming) to assist in the confirmation. Via the device 75, the user may confirm or deny the request by the controller 73 to disarm the alarm device.

In some implementations, the alarm device 76 can be armed or disarmed when the controller 73 determines that the device 75 and/or sensors 71, 72 are disconnected from the communications network 70 coupled to the alarm device 76. For example, if device 75 and/or sensors 71, 72 are disconnected from the network 70 so as to be decoupled from the controller 73 and/or remote system 74, the controller 73 may arm the alarm device 76. That is, the network 70 may be a wireless network having a predetermined communicative range within and/or around the perimeter of a house or building. When an authorized device 75 becomes decoupled from the network 70 (e.g., because the device 75 is outside of the predetermined communicative range) and/or the sensors 71, 72 become decoupled from the network 70, the controller 73 may automatically arm the alarm device 76.

In some implementations, the alarm device 76 may be armed or disarmed when the controller 73 determined that the cable 150 is disconnected from at least one of the controller 73 and/or the power converter 200.

In the security system disclosed herein, sensors 71, 72, sensor 102, or the like can detect a security event, such as a power event (e.g., a power failure when power source 220 no longer can provide power, when the controller 73 and the power converter 200 are not connected by cable 150, and/or when power source 220 and power converter 200 are not connected by cable 210, or the like), a door event (e.g., where a door to a house is opened, closed, and/or compromised), and/or a window event (e.g., where a window of a house is opened, closed, and/or compromised).

For example, based on one or more communication from the sensors 71, 72, 102, and/or the cable interface 110, the controller 73 may determine that a power event has occurred, and may activate the alarm device 76 so as to output a visual and/or audible alarm. In another example, the sensors 71, 72 may have an accelerometer that identifies the force on the door or window as a compromising event. In another example, the sensors 71, 72 may contain an accelerometer and/or compass, and the compromising event may dislodge the sensor from the door or window, and the motion of the sensor 71, 72 may identify the motion as a compromising event. The controller 73 may activate the alarm device 76 according to whether the detected door event or window event is from an outside location (e.g., outside the house, building, or the like). That is, the controller 73 may control the alarm device 76 to output an audible alarm and/or message via a speaker when a door event or window event is detected by the sensors 71, 72. A light of the alarm device 76 may be activated so as to be turned on when one or more sensors 71, 72 detect a security event, such as a door or window event. Alternatively, or in addition, a light may be turned on and off in a pattern (e.g., where the light is turned on for one second, and off for one second; where the light is turned on for two seconds, and off for one second, and the like) when one or more sensors 71, 72 detect a security event such as the window and/or door event.

The controller 73 can control the alarm device 76 to be armed or disarmed according to a preset time period for a user to enter or exit a home or building associated with the security system. The predetermined time can be adjusted by the controller 73 according to the user. For example, as discussed herein, the controller 73 can aggregate data from the sensors 71, 72 to determine when a user enters and exits the home (e.g., the days and times for entry and exit, the doors associated with the entry and exit, and the like). For example, the controller 73 can adjust the amount of time for arming the alarm device 76 to be longer or shorter, according to the amount of time the user takes to exit the house according to the aggregated data.

In the smart home environment disclosed herein when the controller 73 and/or at least one sensor may determine that the user is not occupying the home or building, is outside of the predetermined area for a time greater than a preset time, and/or may determine a power event, the controller 73 can control the alarm device 76 to transition from a first security mode to a second security mode. The second security mode may provide a higher level of security than the first security mode. For example, the second security mode may be a "vacation" mode, where the user of the security system disclosed herein (e.g., the members of a household) are away from the house for a period of time (e.g., 1 day, 3 days, 5 days, 1 week, 2 weeks, 1 month, or the like). As discussed herein, the controller 73 may aggregate the detection data received from the sensors 71, 72 over a preset time (e.g., 1 week, 1 month, 6 months, 1 year, or the like) to determine a pattern for when the user is within the predetermined location or not.

Figure 6:
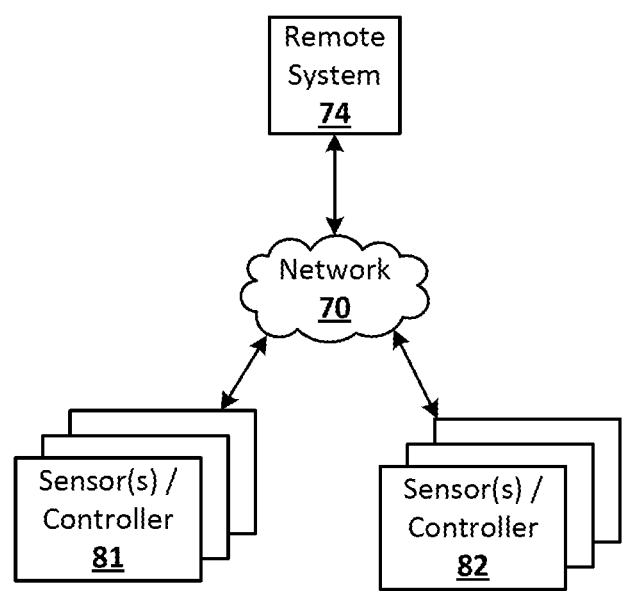
FIG. 6 shows a remote system to aggregate data from multiple locations having security systems according to an implementation of the disclosed subject matter.

In some configurations, as illustrated in FIG. 6, a remote system 74 may aggregate data from multiple locations, such as multiple buildings, multi-resident buildings, and individual residences within a neighborhood, multiple neighborhoods, and the like. In general, multiple sensor/controller systems 81, 82 as previously described with respect to FIGS. 5A-5B may provide information to the remote system 74. The systems 81, 82 may provide data directly from one or more sensors as previously described, or the data may be aggregated and/or analyzed by local controllers such as the controller 73, which then communicates with the remote system 74. The remote system may aggregate and analyze the data from multiple locations, and may provide aggregate results to each location. For example, the remote system 74 may examine larger regions for common sensor data or trends in sensor data, and provide information on the identified commonality or environmental data trends to each local system 81, 82. In one example, the remote system 74 may determine whether local system 81, 82 are experiencing a power failure.

For example, remote system 74 may gather and/or aggregate security event data, environmental event data, and/or power event data from systems 81, 82, which may be geographically proximally located to the security system illustrated in FIGS. 5A-5B. The systems 81, 82 may be located within one-half mile, one mile, five miles, ten miles, 20 miles, 50 miles, or any other suitable distance from the security system of a user, such as the security system shown in FIGS. 5A-5B. The remote system 74 may provide at least a portion of the gathered and/or aggregated data to the controller 73 and/or the device 75 illustrated in FIG. 5B.

The user of the device 75 may receive information from the controller 73 and/or the remote system 74 regarding a security event and/or power event that is geographically proximally located to the user of the device 75 and/or the security system of a building (e.g., a home, office, or the like) associated with the user. Alternatively, or in addition, an application executed by the device 75 may provide a display of information from systems 81, 82, and/or from the remote system 74.

For example, an unauthorized entry to a building associated with systems 81, 82 may occur, where the building is within one-half mile from the building associated with the user of the device 75. The controller 73 and/or the remote system 74 may transmit a message (e.g., a security alert message) to the device 75 that an unauthorized entry has occurred in a nearby building, thus alerting the user to security concerns and/or potential security threats regarding their geographically proximally located building.

In another example, a power event (e.g., a power failure or the like) for a building associated with systems 81, 82 may occur, where the building is within five miles from the building associated with the user of the device 75. The controller 73 and/or the remote system 74 may transmit a message (e.g., a power event alert message) to the device 75 that a power event has occurred in a nearby building, thus alerting the user to security concerns related to power and/or potential security threats regarding their geographically proximally located building.

In another example, a smoke and/or fire event of a building associated with systems 81, 82 may occur, where the building is within 500 feet from the building associated with the user of the device 75. The controller 73 and/or the remote system 74 may transmit a message (e.g., a hazard alert message) to the device 75 that the smoke and/or fire event has occurred in a nearby building, thus alerting the user to safety concerns, as well as potential smoke and/or fire damage to their geographically proximally located building.

In situations in which the systems discussed here collect personal information about users, or may make use of personal information, the users may be provided with an opportunity to control whether programs or features collect user information (e.g., a user's current location, a location of the user's house or business, or the like), or to control whether and/or how to receive content from the content server that may be more relevant to the user. In addition, certain data may be treated in one or more ways before it is stored or used, so that personally identifiable information is removed. For example, specific information about a user's residence may be treated so that no personally identifiable information can be determined for the user, or a user's geographic location may be generalized where location information is obtained (such as to a city, ZIP code, or state level), so that a particular location of a user cannot be determined. As another example, systems disclosed herein may allow a user to restrict the information collected by those systems to applications specific to the user, such as by disabling or limiting the extent to which such information is aggregated or used in analysis with other information from other users. Thus, the user may have control over how information is collected about the user and used by a system as disclosed herein.

Implementations of the presently disclosed subject matter may be implemented in and used with a variety of computing devices. FIG. 7 is an example computing device 75 suitable for implementations of the presently disclosed subject matter. The device 75 may be used to implement a controller, a device including sensors as disclosed herein, or the like. Alternatively or in addition, the device 75 may be, for example, a desktop or laptop computer, or a mobile computing device such as a smart phone, smart watch, wearable computing device, tablet, key FOB, RFID tag, fitness band or sensor, or the like. The device 75 may include a bus 21 which interconnects major components of the device 75, such as a central processor 24, a memory 27 such as Random Access Memory (RAM), Read Only Memory (ROM), flash RAM, or the like, a user display 22 such as a display screen and/or lights (e.g., green, yellow, and red lights, such as light emitting diodes (LEDs) to provide the operational status of the security system to the user, as discussed above), a user input interface 26, which may include one or more controllers and associated user input devices such as a keyboard, mouse, touch screen, and the like, a fixed storage 23 such as a hard drive, flash storage, and the like, a removable media component 25 operative to control and receive an optical disk, flash drive, and the like, and a network interface 29 operable to communicate with one or more remote devices via a suitable network connection.

The bus 21 allows data communication between the central processor 24 and one or more memory components 25, 27, which may include RAM, ROM, and other memory, as previously noted. Applications resident with the device 75 are generally stored on and accessed via a computer readable storage medium.

The fixed storage 23 may be integral with the device 75 or may be separate and accessed through other interfaces. The network interface 29 may provide a direct connection to a remote server via a wired or wireless connection. The network interface 29 may provide a communications link with the network 70, sensors 71, 72, controller 73, and/or the remote system 74 as illustrated in FIGS. 5A-5B. The network interface 29 may provide such connection using any suitable technique and protocol as will be readily understood by one of skill in the art, including digital cellular telephone, radio frequency (RF), Wi-Fi, Bluetooth®, Bluetooth Low Energy (BTLE), near-field communications (NFC), and the like. For example, the network interface 29 may allow the device to communicate with other computers via one or more local, wide-area, or other communication networks, as described in further detail herein.

Various implementations of the presently disclosed subject matter may include or be embodied in the form of computer-implemented processes and apparatuses for practicing those processes. Implementations also may be embodied in the form of a computer program product having computer program code containing instructions embodied in non-transitory and/or tangible media, such as hard drives, USB (universal serial bus) drives, or any other machine readable storage medium, such that when the computer program code is loaded into and executed by a computer, the computer becomes an apparatus for practicing implementations of the disclosed subject matter. When implemented on a general-purpose microprocessor, the computer program code may configure the microprocessor to become a special-purpose device, such as by creation of specific logic circuits as specified by the instructions.

Implementations disclosed herein may use hardware that may include a processor, such as a general purpose microprocessor and/or an Application Specific Integrated Circuit (ASIC) that embodies all or part of the techniques according to implementations of the disclosed subject matter in hardware and/or firmware. The processor may be coupled to memory, such as RAM, ROM, flash memory, a hard disk or any other device capable of storing electronic information. The memory may store instructions adapted to be executed by the processor to perform the techniques according to implementations of the disclosed subject matter.

The foregoing description, for purpose of explanation, has been described with reference to specific implementations. However, the illustrative discussions above are not intended to be exhaustive or to limit implementations of the disclosed subject matter to the precise forms disclosed. Many modifications and variations are possible in view of the above teachings. The implementations were chosen and described in order to explain the principles of implementations of the disclosed subject matter and their practical applications, to thereby enable others skilled in the art to utilize those implementations as well as various implementations with various modifications as may be suited to the particular use contemplated.

The invention claimed is:

1. A security system comprising:
   a controller, including a cable interface, to control an output of a notification when a condition is determined based on at least one signal received by the controller at the cable interface;
   a power converter coupled to a power source to convert power received by the power source for the controller; and
   a cable having at least one connector that includes a plurality of pins, wherein the cable is coupled between the power converter and the cable interface of the controller and provides the converted power via a power pin and the at least one signal via an identification pin to the cable interface of the controller, wherein the controller is configured to determine when the cable is disconnected between the power converter and the cable interface of the controller by determining when a resistor of the cable interface pulls the receiving portion of the cable interface for the identification pin to a predetermined high output level, and when there is a power failure or the power converter is not receiving power from the power source, to determine that the receiving portion of the cable interface for the identification pin is grounded at the power converter so as to operate at a predetermined low output level, and wherein the controller outputs the notification based on the determined high output level or low output level of the at least one signal received by the cable interface of the controller.

2. The system of claim 1, wherein when the cable is coupled to the controller and the power converter, the at least one signal is pulled to the predetermined high output level by the controller and the at least one signal is grounded by the power converter.

3. The system of claim 1, wherein the controller determines that there is the power outage or the power converter is disconnected from the power source when the at least one signal outputs the predetermined low output level at the controller and is grounded by the power converter.

4. The system of claim 1, wherein when the cable is disconnected from at least one of the controller and the power converter, the at least one signal is pulled to output the predetermined high output level at the controller.

5. The system of claim 1, wherein the resistor of the cable interface of the controller is a pull-up resistor.

6. A method comprising:

controlling, at a controller, an output of a notification when a condition is determined based on at least one signal received by a cable interface of the controller;

converting, at a power converter coupled to a power source, power received by the power source for the controller;

coupling, at a cable having at least one connector that includes a plurality of pins, the power converter and the cable interface of the controller together, and providing the converted power via a power pin and the at least one signal via an identification pin to the cable interface of the controller;

determining, at the controller, when the cable is disconnected between the power converter and the controller by determining when a resistor of the cable interface of the controller pulls the receiving portion of the cable interface for the identification pin to a predetermined high output level;

determining, at the controller, when there is a power failure or the power converter is not receiving power from the power source by determining that the receiving portion of the cable interface for the identification pin is grounded at the power converter so as to operate at a predetermined low output level; and outputting, at the controller, the notification based on a the determined high output level or low output level of the at least one signal received by the cable interface of the controller.

7. The method of claim 6, further comprising:
when the cable is coupled to the controller and the power converter, pulling the at least one signal to the predetermined high output level by the controller.

8. The method of claim 6, further comprising:
determining, at the controller, that there is the power outage or the power converter is disconnected from the power source when the identification pin outputs the predetermined low output level at the controller.

9. The method of claim 6, further comprising:
setting the at least one signal to output the predetermined high output level when the cable is disconnected from at least one of the controller and the power converter.

* * * * *